United States Patent
Mochida

(10) Patent No.: US 8,233,344 B2
(45) Date of Patent: Jul. 31, 2012

(54) SEMICONDUCTOR DEVICE

(75) Inventor: Noriaki Mochida, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 252 days.

(21) Appl. No.: 12/783,918

(22) Filed: May 20, 2010

(65) Prior Publication Data
US 2010/0296355 A1 Nov. 25, 2010

(30) Foreign Application Priority Data
May 21, 2009 (JP) .................. 2009-123196

(51) Int. Cl.
G11C 7/00 (2006.01)
(52) U.S. Cl. ............... 365/205; 365/189.02; 365/219; 365/233.1
(58) Field of Classification Search .......... 365/205, 365/189.02, 210, 233.1, 230.02, 226
See application file for complete search history.

(56) References Cited

U.S. PATENT DOCUMENTS
7,626,877 B2 * 12/2009 Kim et al. .......... 365/205

FOREIGN PATENT DOCUMENTS
JP 9-251777 A 9/1997
* cited by examiner

Primary Examiner — David Lam
(74) Attorney, Agent, or Firm — Sughrue Mion, PLLC

(57) ABSTRACT

A semiconductor device includes a plural number of sense amplifiers that sense at least two data in parallel and that operate under a first frequency, and a multiplexer that operates under a second frequency higher than the first frequency and that sequentially serially outputs the data sensed in parallel. The semiconductor device also includes a driver circuit having a latch circuit connected to an output of the multiplexer, and an output driver circuit connected to the latch circuit and operating under the second frequency. The voltage of a power supply of the sense amplifiers is the same as the voltage of a power supply of the output driver circuit. The power supply of the sense amplifiers and the power supply of the output driver circuit are connected to respective different power supply lines.

20 Claims, 8 Drawing Sheets

SEMICONDUCTOR DEVICE

REFERENCE TO RELATED APPLICATION

This application is based upon and claims the benefit of the priority of Japanese patent application No. 2009-123196, filed on May 21, 2009, the disclosure of which is incorporated herein in its entirety by reference thereto.

TECHNICAL FIELD

This invention relates to a semiconductor device. More particularly, it relates to a semiconductor device having a sense amplifier for sensing a plurality of data in parallel, and a driver circuit that sequentially outputs sensed data, such as a semiconductor device having a memory.

BACKGROUND

In keeping up with the demand for reducing the power consumption, the power supply voltage of a semiconductor device is decreasing in these days. For example, in the spec for the DDR2 SDRAM (Double Data Rate 2 Synchronous DRAM), the external voltage is set at 1.8V. Recently, to further reduce the power consumption, an internal voltage step-down circuit is used to provide an internal voltage lower than the external voltage. On the other hand, there is a demand for faster access to the semiconductor device. For example, in a synchronous DRAM, such as the above mentioned DDR2 SDRAM, an ultra-high speed memory access, exceeding 1 Gbps, is needed. To realize the faster access with the use of the internal power supply voltage, thus suppressed to an extremely low value, suppression of the power supply noise in the semiconductor device becomes crucial since the power supply noise within the semiconductor device is increased in the high-speed operation.

In Patent Document 1, there is disclosed a DRAM in which a power supply line L1 that delivers a reference potential Vcc1 to a sense circuit composed e.g., of an X-decoder and a sense amplifier is isolated from a power supply line L3 that delivers a reference potential Vcc2 to an output circuit composed of a read amplifier and an output buffer. These power lines are run by respective separate power supplies. Patent Document 1 states that potentials Vcc2 and Vcc1 are interconnected by a diode, and that, if the potential Vcc1 on the power supply line L1 is varied due to power consumption in the sense circuit, the power supply lines L1, L3 are electrically connected to each other. These potential variations on the power supply line L1 are dispersed in the power line L3 to suppress potential variations in the power supply line L1.
[Patent Document 1]
JP Patent Kokai Publication No. JP-A-9-251777

SUMMARY

The entire disclosure of Patent Document 1 is incorporated herein by reference thereto.

The following analysis is given by the present invention. In Patent Document 1, a power supply system of a read amplifier and a power supply system of an output buffer are used in common. However, if, in this case, continuously read out data are output, it may occur that, in outputting read-out data, the power supply noise of the output buffer affects the sensing operation of the next read data, thus obstructing the high-speed read operation as well as the high-speed data transfer operation.

In particular, in the first parallel-to-serial conversion, following a pre-fetch operation, such as in DDR, pre-fetched multiple data bits are sequentially converted from the parallel data state to the serial data state. The so generated serial data is output to an internal data bus of a longer length as later described. It is noted that the length of the internal data bus is longer than the length of one side of a plurality of memory cell arrays. It is also noted that the frequency of the serial data outputting operation is several times as high as that of the pre-fetch operation. The memory cell array side performs a second pre-fetch operation of sensing the data from a different address (memory cell) for the next burst read, at the same time as it serially outputs the last data.

With increase in the storage capacity, the consumption of the current needed for driving for outputting a data bit following the above mentioned first parallel-to-serial conversion, and the noise of the peak current, are becoming of a problem. It is noted that this data bit is transmitted to a data output buffer which is the last driving circuit driving the external data terminal (I/O terminal) of a semiconductor device. The data output buffer includes a second parallel-to-serial converter circuit.

It is noted that this first parallel-to-serial conversion represents a point of interruption of the pipelining operation in a synchronous semiconductor device. The second pre-fetch operation on the memory cell array side and the outputting operation to the internal data bus occur in parallel by an internal synchronization signals relating with an external synchronization signal. As a result, the operation of driving to the internal data bus suffering much noise may cause malfunctions of the sense amplifier performing the second pre-fetch operation. The amount of the noise becomes the larger the higher the frequency of the driving operation for the internal data bus is than the frequency of the sense operation of the sense amplifiers. The amount of the noise also becomes the larger the longer the length of one side of the memory cell array.

According to a first aspect of the present invention there is provided a semiconductor device, which comprises a plurality of sense amplifiers that sense at least two data in parallel and that operate at a first frequency, and a multiplexer. The multiplexer operates at a second frequency higher than the first frequency and sequentially serially outputs the data sensed in parallel. The semiconductor device also comprises a driver circuit including a latch circuit connected to an output of the multiplexer and also including an output driver circuits. The output driver circuit is connected to the latch circuit and operates at the second frequency. The voltage of a power supply for the plurality of sense amplifiers is of the same value as that of a power supply for the output driver circuit. The power supply for the sense amplifiers is connected to a power supply line different from a power supply line to which the power supply for the output driver circuit is connected.

According to a second aspect of the present invention there is provided a semiconductor device, which comprises a plurality of sense amplifiers that sense at least two data in parallel and that operate at a first frequency, and a multiplexer. The multiplexer operates at a second frequency higher than the first frequency and sequentially serially outputs the data sensed in parallel. The semiconductor device also comprises a latch circuit connected to an output of the multiplexer, and an output driver circuits that outputs data of the latch circuit to a data bus at the second frequency. The plurality of sense amplifiers sequentially time-divisionally sense a number of data in excess of the number of the sense amplifiers. The sequentially sensed multiple data are pipeline-processed by the multiplexer so as to be sequentially output from the output driver circuit to the data bus. The plurality of sense amplifiers and the output driver circuit operate at the same power supply voltage. A power supply for the multiple sense amplifiers and a power supply for the output driver circuit are connected to respective different power supply lines.

According to a third aspect of the present invention there is provided a semiconductor device, which comprises a plurality of first circuits, a second circuit and a third circuit. The first circuits operate at a first frequency to sense first data to output the data sensed, and the second circuit operates at a second frequency higher than the first frequency. The second circuit receives a plurality of the sensed first data in parallel and serially outputs second data. The third circuit latches the second data output from the second circuit to amplify and output the second data latched. The first circuits and the third circuit operate under the same power supply voltage. A first power supply that supplies the power to the plurality of first circuits and a third power supply that supplies the power to the third circuit are connected to respective different power supply lines.

The meritorious effects of the present invention are summarized as follows.

According to the present invention, the power supply for the sense amplifier corresponding to the read amplifier of Patent Document 1 (second sense amplifier) is isolated from the power supply of the output driver circuit (first data driver circuit). Hence, the sense amplifier (read amplifier) is hardly affected by the power supply noise of the output driver, thus achieving fast readout.

BRIEF DESCRIPTION OF THE DRAWINGS

FIG. 8A is a block diagram showing a formulation in case the voltage supplied from the external I/O dedicated power supply terminal is not higher than the internal power supply voltage and FIG. 8B is a block diagram showing a formulation in case the voltage supplied from the external I/O dedicated power supply terminal is higher than the internal power supply voltage.

PREFERRED MODES

Figure 1:
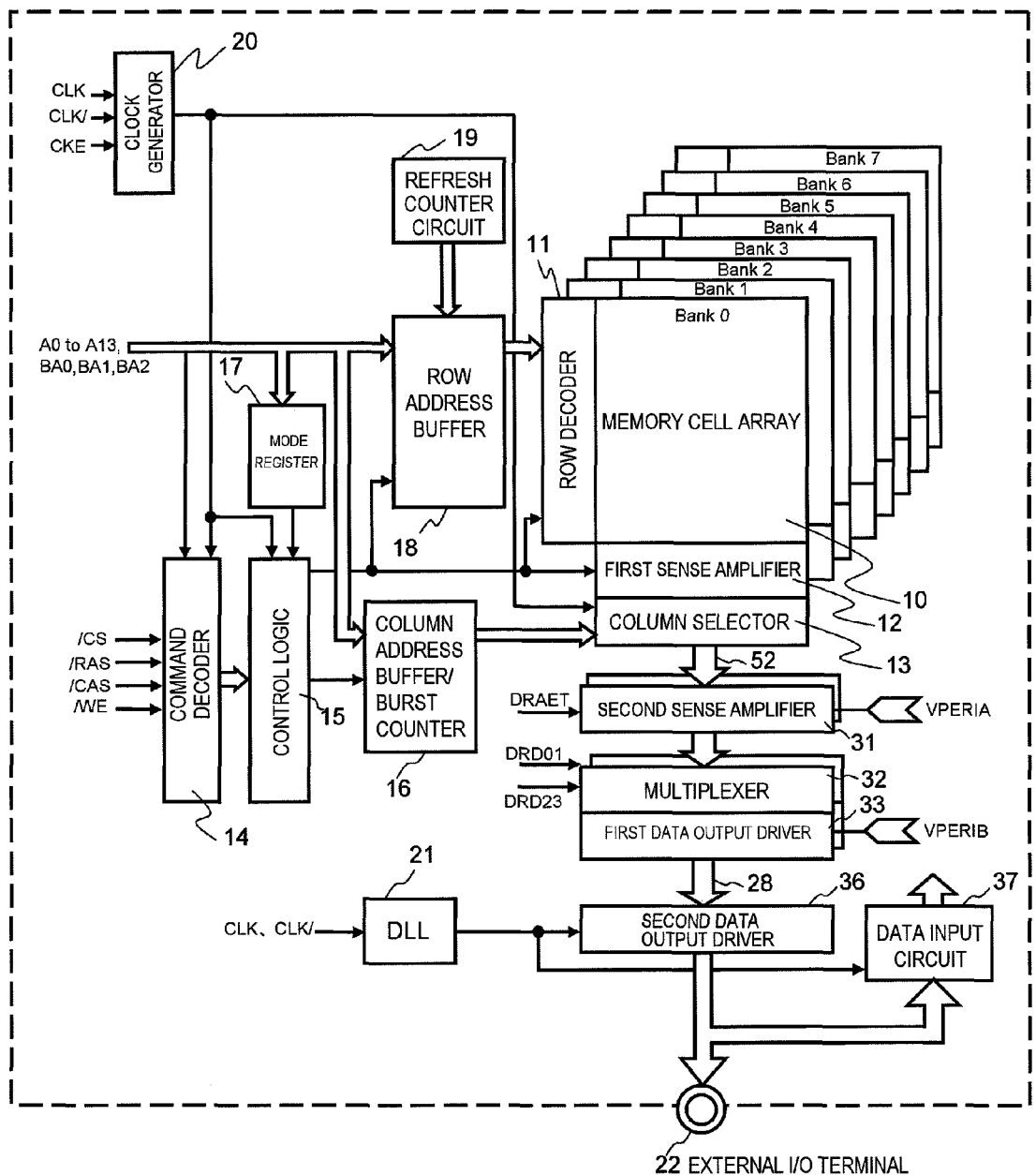
FIG. 1 is a block diagram showing a semiconductor device according to an example of the present invention, in its entirety.

The schematics of the present invention will now be described by referring to the drawings as necessary. It is noted that the drawings and the reference numerals used therein are shown only by way of examples and are not to be understood as limiting the variations of the examples. It is also noted that the claimed contents of the present application are not limited to the schematics and reside in the contents as stated in the claims.

In an exemplary embodiment of the semiconductor device according to the present invention, a power supply for a plurality of the sense amplifiers, operating under the first frequency and another power supply for a plurality of the output driver circuits are connected to respective different power supply lines. The output driver circuits deliver a serial output via a multiplexer that operates under a second frequency different from the first frequency and that converts parallel outputs of the multiple sense amplifiers into a serial output. Thus, even if the timing of the output driver circuits in driving a load and the timing of sensing of the sense amplifiers coincide with each other, it is possible to eliminate the effect the power supply noise generated on load driving by the output driving circuits might have on the sensing by the sense amplifiers. It is thus possible for the sense amplifiers to execute the high-speed sensing of high reliability and for the output driving circuits to effect the driving of a large load at a high frequency. It is noted that the driving of the large load means the driving of a signal line of high parasitic capacitance having a length longer than the length of one side of a memory cell array. The data sensed by the sense amplifiers is supplied to the output driver circuits via the multiplexers and the latch circuits. The above mentioned sense amplifiers correspond to the read amplifiers in Patent Document 1.

The semiconductor device includes a plurality of memory cell arrays each of which is composed of a multiplicity of memory cells and a plurality of access circuits that access the memory cells. The sense amplifiers sense at least two of memory cell data, accessed by the access circuits, in parallel. A power supply of the access circuits (a power supply line in the memory cell array) and a power supply of the sense amplifiers are connected to each other. Since the power supply line of significant parasitic capacitance in the memory cell array is connected to the power supply of the sense amplifiers, it is possible to provide a power supply for the sense amplifiers which is stable and which is less susceptible to variations without dependency upon the output driver circuits operating at a high frequency. As regards the power supply for the access circuits, the power supply of the sense amplifiers may further be stabilized by providing mesh-like interconnections for the power supply for the access circuits in the memory cell array and by connecting the power supply to the sense amplifiers. It is noted that the multiple sense amplifiers are provided in association with each of the multiple memory cell arrays.

The semiconductor device also includes an output buffer circuit provided with a parallel-to-serial converter circuit that operates at a third frequency higher than the second frequency and that is connected to outputs of the output driver circuits. A power supply of the output driver circuits operating under a second frequency and a power supply of the parallel-to-serial converter circuit operating under a third frequency are connected to respective different power supply lines. It is thus possible to eliminate the effect the noise of the power supply of the parallel-to-serial circuit operating at a high frequency might have on the power supply for the sense amplifiers or on the power supply of the output buffer. In addition, high-reliability data transfer at a higher speed may be achieved even in case the parallel-to-serial converter circuit is spaced apart from the output buffer circuit, viz., in case a signal line being driven is of a length longer than the length of a side of the memory cell array and hence suffers from significant parasitic capacitance.

In the above arrangement, the power supply system for the access circuits for the memory cells, provided in the memory cell array, and the power supply system for the sense amplifiers provided externally of the memory cell array (second sense amplifiers operating under the first frequency) are used in common. The access circuits sense data of the memory cell array at a first frequency or at a frequency lower than the first frequency to output the sensed memory cell data to outside the memory cell array. The sense amplifiers, provided externally of the memory cell array, and operating at the first frequency, sense the memory cell data in an area outside the memory cell array, to output the so sensed memory cell data to the multiplexers 32 operating at the second frequency. The multiplexers and the output driver circuits, amplifying and driving-outputting the resulting output, transfer data to an internal data bus 28 at the second frequency higher than the first frequency. The internal data bus 28 has a length longer than the length of a side of the memory cell array. The power supply of the sense amplifiers (second amplifiers operating at the first frequency) may thus be freed of the power supply noise generated due to data switching in the output driver circuits In the above arrangement, the power supplies for the access circuits and the second sense amplifiers, arranged from one memory cell array to another for operating at the lowest first frequency, are connected common. The power supply of the output driver circuit that includes the multiplexer operating at the second frequency higher than the first operating frequency, is connected to a different power supply line. The power supply of the parallel-to-serial converter circuit, operating at a third frequency higher than the second frequency, is connected to a further different power supply line. The parallel-to-serial converter circuit is provided common to the multiple memory cell arrays, and input the output data of the multiple output driver circuits in parallel to perform parallel-to-serial conversion. Thus, even if the power supply noise has occurred in the power supply system of the parallel-to-serial converter circuit, operating at the highest frequency, the effect of the power supply noise is not directly applied to the output driver circuits or to the first and second amplifiers operating at lower frequencies. Attention should be exercised to the fact that the above mentioned circuits are run in a coordinated operation in parallel by a synchronization control signal. The present invention will now be described in detail with reference to Examples shown in the drawings.

EXAMPLE 1

FIG. 1 depicts a block diagram showing a semiconductor device (semiconductor memory device) 1 of Example 1 in its entirety. The semiconductor device 1 of FIG. 1 is a synchronous DRAM, such as DVR2. In FIG. 1, 10 denotes a memory cell array, and 11 denotes a row decoder that decodes a row address and that drives a word line selected on decoding the row address. 12 denotes a first sense amplifier that senses data of a memory cell selected from the memory cell array, and 13 denotes a column selector that outputs to outside the memory cell data selected based on a column address out of a multiplicity of data sensed by the first sense amplifier. Eight memory cell arrays 10 of Bank0 to Bank7 are provided in the semiconductor device 1. The row decoder 11, a plurality of first sense amplifiers 12 and a plurality of the column selectors 13 are provided from one memory cell array to another.

A plurality of second sense amplifiers 31, a plurality of multiplexers 32 and a plurality of first data output drivers 33 are provided outside the memory cell array 10 from one memory cell array 10 to another. The second sense amplifiers 31 sense memory cell data read out to outside the memory cell array 10 via the first sense amplifiers 12, the column selectors 13 and a plurality of I/O lines 52. The multiplexers 32 sequentially output data, sensed by the second sense amplifiers 31, to the first data output drivers 33. The first data output drivers 33 output data, selected by the multiplexers 32, to a data bus 28. A second data output driver 36 is preferably arranged in the vicinity of an external I/O terminal 22. The second data output driver parallel-serial converts data, supplied thereto over the data bus 28 from the first data output driver 33, and outputs the resulting data at the external I/O terminal 22 in synchronism with the rising and falling edges of a data strobe signal. A data input circuit 37 is connected to the external I/O terminal 22, so that write data input from the external I/O terminal 22 is written via the data input circuit 37 in the memory cell array 10.

A clock generator 20 generates an internal operating clock from a non-inverted clock signal CLK, an inverted clock signal /CLK and a clock enable signal CKE, all of which are supplied from outside. A command decoder 14 generates commands, such as read command or write command, supplied from e.g., an external memory controller to the semiconductor device 1, by decoding a chip select signal /CS, a row address strobe signal /RAS, a column address strobe signal /CAS and a write enable signal /WE, all of which are supplied from outside. A control logic 15 outputs signals needed to execute commands to each part of the semiconductor device 1, in synchronism with a clock supplied from the clock generator 20, based on the command generated by the command decoder 14 and on the state of a mode register 17. External address input terminals A0 to A13 and bank address input terminals BA0, BA1 and BA2 are connected to the mode register 17, a column address buffer/burst counter 16 and a row address buffer 18 over inner address buses. When supplied with a mode register setting command, the mode register 17 sets data supplied from the inner address bus therein. When supplied with a bank address ACT command, the row address buffer 18 latches a row address to output it to the row decoder 11. When supplied with a read command and a write command, the column address buffer/burst counter 16 latches a column address and decodes it to select the column selectors 13. When supplied with a burst read/burst write command, the column address buffer/burst counter counts a column address based on a burst length specified. A refresh counter circuit 19 counts up refresh addresses. Based on an external clock signal, supplied at external clock terminals CLK, /CLK, a DLL 21 generates a clock signal in-phase with the external clock signal to control the timing of data input/output at the external I/O terminal 22.

Figure 2:
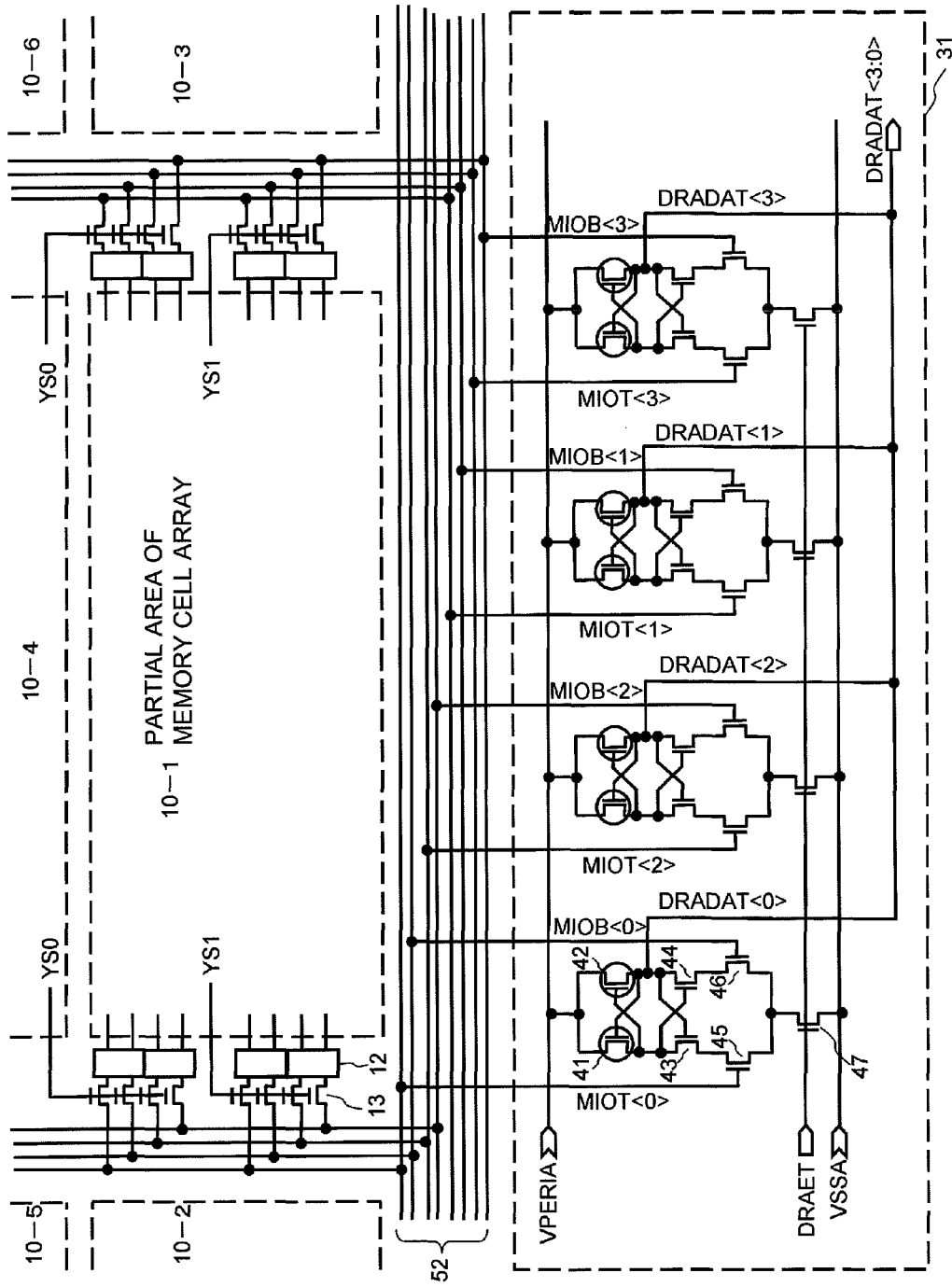
FIG. 2 is a block diagram showing a memory cell array, a first sense amplifier and a second sense amplifier with its vicinity according to an example.

FIG. 2 depicts a block diagram showing the vicinity of the memory cell array 10, first sense amplifiers 12 and the second sense amplifiers 31 of Example 1. 10-1 denotes an area of a part of the memory cell array 10 shown in FIG. 1. In FIG. 2, only the first sense amplifiers 12 and the column selectors 13, provided in association with the partial area 10-1 of the memory cell array 10, are shown.

Memory cell data read out from the partial area 10-1 of the memory cell array are sensed by the first sense amplifiers 12. In FIG. 2, eight of the first sense amplifiers 12 are provided for the partial area 10-1. When a row address is specified, data are read out to the respective associated first sense amplifiers 12 from eight memory cells that share the row address. Out of the data read out from the eight memory cells to the eight first sense amplifiers 12, 4-bit data are selected by the column selectors 13 so as to be read out to the I/O lines 52. It is noted that the I/O lines 52, bi-directional buses for simultaneously transmitting four pair complementary signals, are made up of non-inverted signals MIOT <0:3> of bits 0 to 3 and inverted signals MIOB <0:3> of bits <0:3>. Meanwhile, the column selectors 13 are each a NMOS transistor. Out of the 8-bit data, read out simultaneously to the first sense amplifiers 12 by column address selection signals YS0, YS1, applied to the gates of the NMOS transistors, 4-bit data are selected and output to the I/O lines 52.

The 4-bit complementary signals MIOT (0:3) and MIOB (0:3), output to the I/O lines 52, are sensed by the second sense amplifiers 31. These second sense amplifiers 31 are provided externally of and in association with the memory cell array 10, and are arrayed in adjacency to the coordinated memory cell array 10. The second sense amplifiers 31 are also termed data amplifiers or read amplifiers. The number of the second sense amplifiers 31 is set to four in keeping with the number of bit lines of the I/O lines 52.

Each sole second sense amplifier 31 includes NMOS transistors 47, 45, 46, 43 and PMOS transistors 41, 42. The source of the NMOS transistor 47 is connected to a low voltage power supply interconnection VSSA for the second sense amplifiers. To the gate of the NMOS transistor 47 is coupled a second sense amplifier activation signal DRAET. The sources of the NMOS transistors 45, 46 are connected to the drain of the NMOS transistor 47. To the gates of the NMOS transistors 45, 46 are respectively coupled complementary signals MIOT and MIOB on the I/O lines 52. The NMOS transistor 43 and the PMOS transistor 41 are connected in series between the drain of the NMOS transistor 45 and a high power supply interconnection VPERITA for the second sense amplifiers. The NMOS transistor 44 and the PMOS transistor 42 are connected in series between the drain of the NMOS transistors 46 and the high voltage power supply interconnection VPERIA for the second sense amplifiers. The gates of the NMOS transistor 43 and the PMOS transistor 41 are connected to the drains of the NMOS transistor 44 and the PMOS transistor 42. The gates of the NMOS transistor 44 and the PMOS transistor 42 are connected to the drains of the NMOS transistor 43 and the PMOS transistor 41. The signal on the drains of the NMOS transistor 44 and the PMOS transistor 42 of the second sense amplifier 31 is output to outside as an output signal DRADAT of the second sense amplifier 31.

In FIG. 2, only the partial area 10-1 of the memory cell array 10 and the first sense amplifiers 12 as well as the column selectors 13 associated therewith are shown for simplicity of explanation. However, partial areas 10-2 and 10-3 of the memory cell array 10 are provided in the memory cell array 10 via the I/O lines 52 on the left and right sides of the partial area 10-1 of the memory cell array. Partial areas 10-4, 10-5 and 10-6 are similarly provided on the opposite side of the partial area 10-1 of the memory cell array with respect to the second sense amplifiers 31. The first sense amplifiers 12 as well as the column selectors 13, associated with the partial areas 10-2 to 10-6 of the memory cell array other than the partial area 10-1, are not shown. However, these partial areas 10-2 to 10-6 are also connected to the I/O lines 52 via the first sense amplifiers 12 and the column selectors 13. To the respective column selectors 13 are coupled different column selection signals. As regards the memory cell array 10 in its entirety, the partial areas of the memory cell array, the first sense amplifiers 12 and the column selectors 13 are arranged in a matrix pattern with the interposition of the I/O lines 52. Out of the partial areas of the memory cell array, arranged in the matrix pattern, the partial area 10-1 of the memory cell array 10 is an end partial area, which is arranged closest to the second sense amplifiers 31. In this manner, the first sense amplifiers 12 and the column selectors 13 are arranged incorporated into the inside of the memory cell array 10, while the second sense amplifiers 31 are arranged externally of the memory cell array 10. It is noted that a plurality of first sense amplifiers 12 are connected via the I/O lines 52 and the column selectors 13 to a set (four bits in FIG. 2) of the second sense amplifiers 31.

Figure 3:
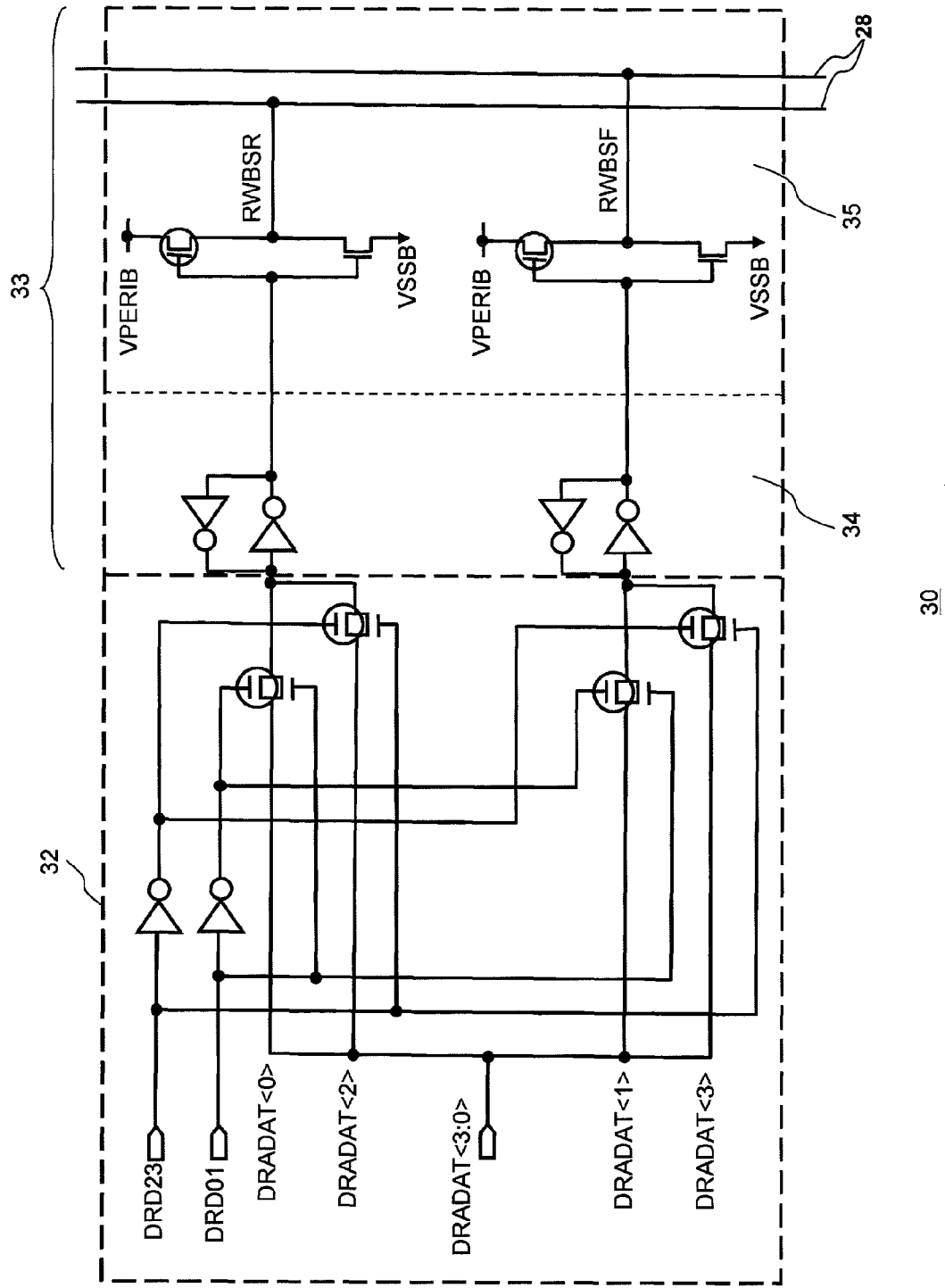
FIG. 3 is a block diagram showing a multiplexer driver circuit according to an example.

FIG. 3 depicts a block diagram of a multiplexer driver circuit 30 according to Example 1. The multiplexer driver circuit 30 includes the multiplexer 32 and the first data output driver 33. The multiplexer driver circuit 30 inputs the 4-bit data signals DRADAT <0:3>, output by the second sense amplifiers 31, and selects 2 bits at a time by selector changeover control signals DRD01, DRD23 to sequentially output the so selected data. In short, the multiplexer 32 has the function of a first pipeline of effecting parallel-to-serial conversion between the memory cell array side and the external I/O terminal 22 by the selector changeover control signals operating as synchronization signals. A latch circuit 34, as later described, is a circuit indispensable for pipeline control. When the latch circuit 34 retains the trailing side second bit of the two parallel input bits, the selector changeover control signals turn off the transfer gate (switch) in the multiplexer 32. During this time, the second sense amplifiers 31 read out the next pre-fetch data from the memory cell array 10.

The first data output driver 33 sequentially outputs data, received from the multiplexer 32, as first data output driver output signals RWBSR, RWBSF. The first data output driver 33 includes the latch circuit 34 that transiently holds data received from the multiplexer 32. By providing the latch circuit 34, the data sensed by the second sense amplifiers 31 may be read out up to the multiplexer 32 in parallel with the data outputting operation of an output driver circuit 35 of the first data output driver 33. It is noted that the power for the first data output driver 33 is delivered from a high voltage power supply interconnection VPERIB for the output driver circuit and a low voltage power supply interconnection VSSB for the output driver circuit different from the corresponding power supply interconnections for the second sense amplifiers 31. It is noted that first driver circuit output signals RWBSR, RWBSF are coupled, as part of the signal on the data bus 28, to the second data output driver 36 of FIG. 1.

Figure 4:
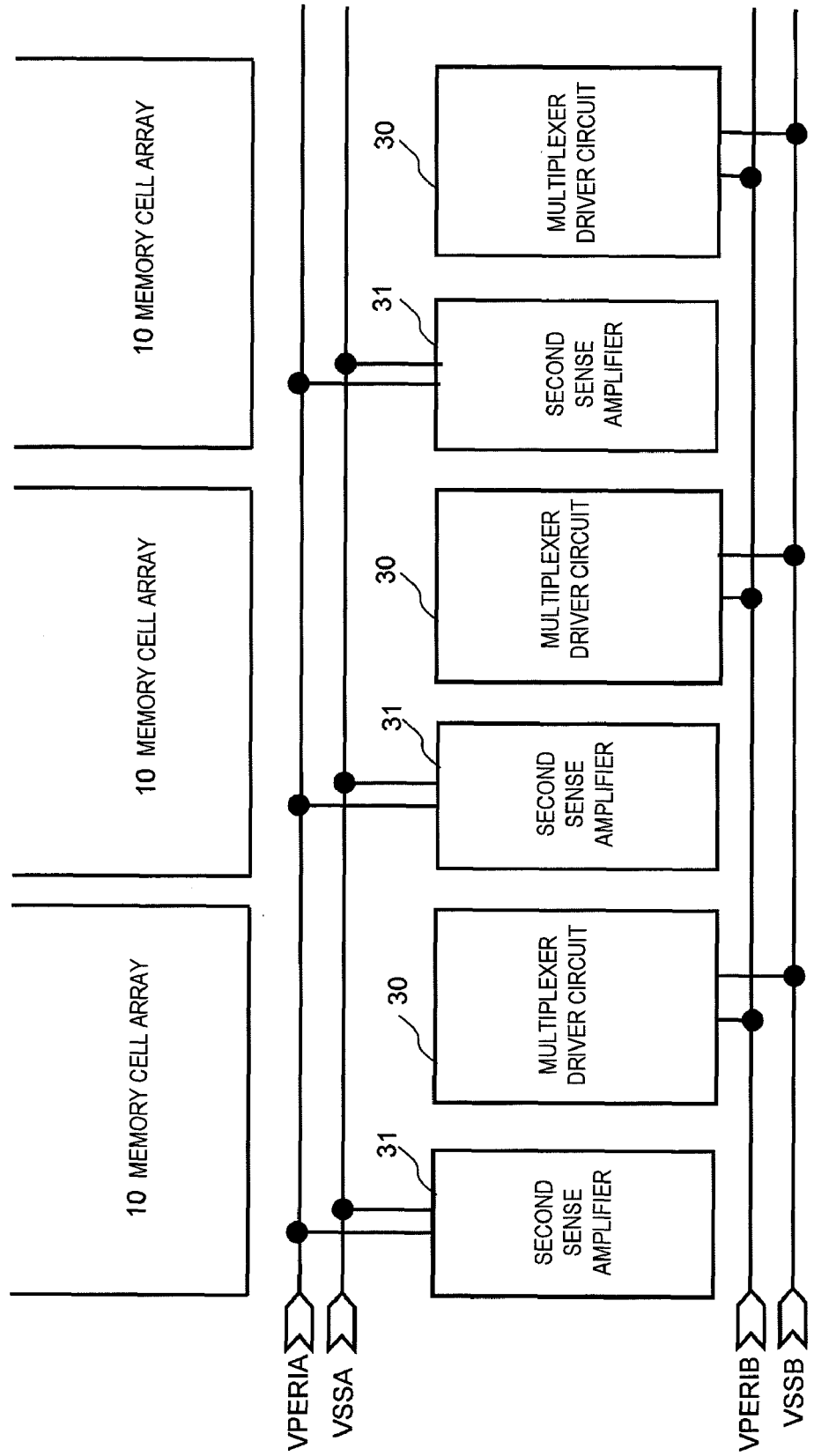
FIG. 4 is a power supply wiring diagram for second sense amplifiers and multiplexer driver circuits according to an example.

FIG. 4 shows a power supply interconnection diagram for the multiple second sense amplifiers 31 and the multiple multiplexer driver circuits 30 according to Example 1. The semiconductor device 1 includes a plurality of memory cell arrays 10, and the second sense amplifiers 31 are provided in adjacency to the memory cell array 10 coordinated thereto. Similarly to the second sense amplifiers 31, the multiplexer driver circuits 30 are provided in terms of the memory cell arrays as units, and are arranged in adjacency to the second sense amplifiers 31 coordinated thereto. It is noted that the second sense amplifiers 31 are arranged in adjacency to the memory cell array 10 and the multiplexer driver circuits 30 are provided in adjacency to the second sense amplifiers 31 in order to achieve fast transfer of data. Hence, the second sense amplifiers 31 and the multiplexer driver circuits 30 are arranged in association with the memory cell array 10, as shown in FIG. 4. However, the power supply interconnection and the power supply system of the second sense amplifiers 31 are separated from the power supply interconnection and the power supply system of the output driver circuits 35 of the multiplexer driver circuits 30. By so doing, it is contemplated to prevent the switching noise of the multiplexer driver circuits 30 from affecting the sensing of the second sense amplifiers 31 to prevent the delay in sensing. Viz., the power is supplied to each of the second sense amplifiers 31 from the high voltage power supply interconnection VPERIA for the second sense amplifiers 31 and from the low voltage power supply interconnection VSSA for the second sense amplifiers 31. On the other hand, the power is supplied from the high voltage power supply interconnection VPERIB for the output driver circuits and from the low voltage power supply interconnection VSSB for the output driver circuits to the output driver circuits 35 of the multiplexer driver circuits 30.

Figure 5:
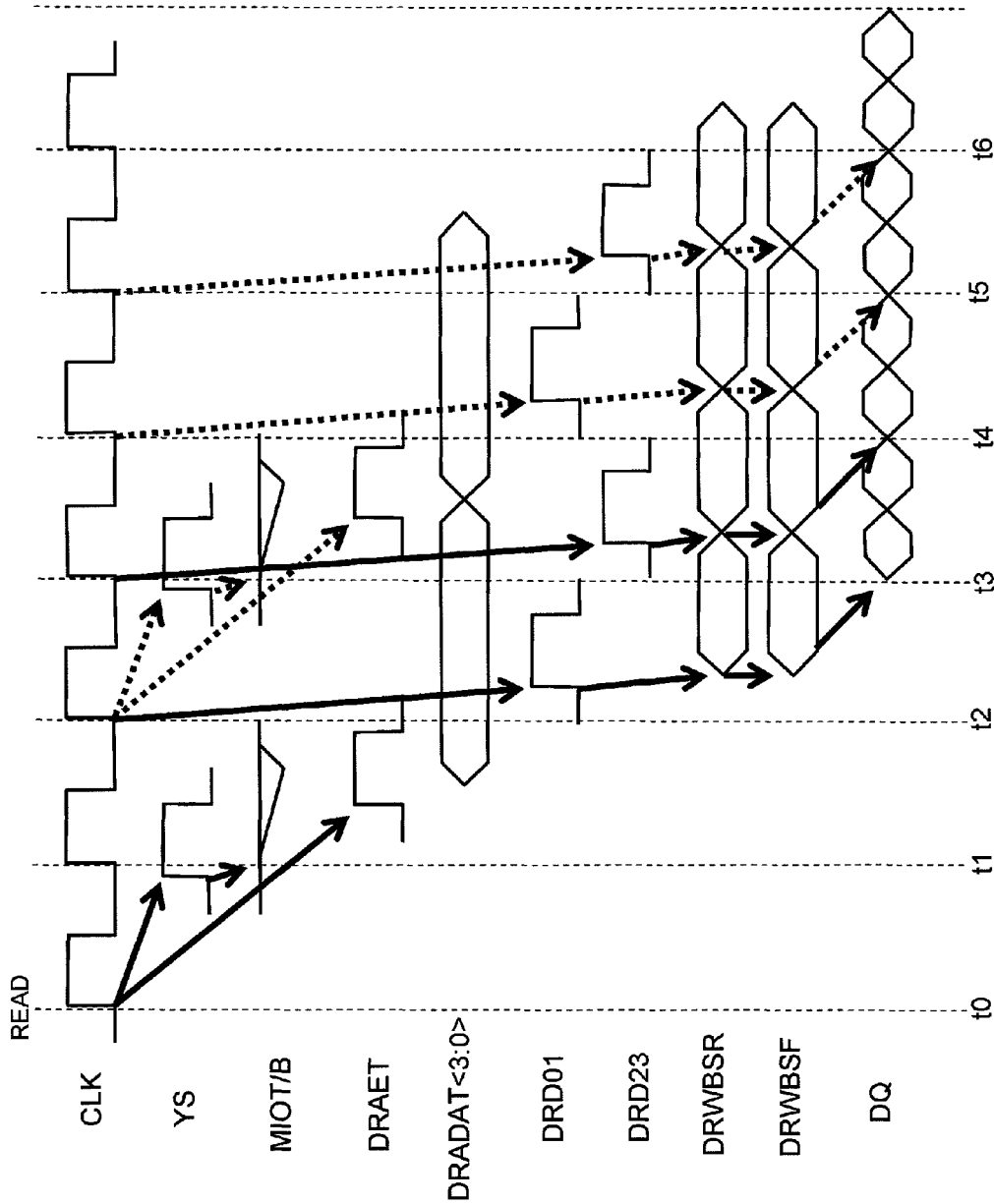
FIG. 5 is an operational timing diagram of an example.

FIG. 5 depicts an operational timing diagram for a case where the semiconductor device 1 of Example 1 performs a burst read operation. In FIG. 5, the additive latency AL=0, /CAS latency CL=3 and the burst length BL=8. In FIG. 5, a read command is entered in synchronism with the rising of an external clock signal CLK at a cycle t0. Towards the end of the cycle t0, a column selection signal YS rises to cause the column selector 13 of the specified column address to be turned on. From the column selector 13, thus turned on, data MIOT/B, sensed by the first sense amplifier 12, is output at a cycle t1 to the I/O line 52. In the latter half of the cycle t1, the second sense amplifier activation signal DRAET rises. A data signal of an extremely low strength MIOT/B on the I/O line 52 is amplified by the second sense amplifiers 31, which second sense amplifiers 31 output the amplified signal as the second amplifier output signal DRADAT <3:0>. Then, in a cycle t2, a selector changeover control signal DRD01 rises, and bit 0 and bit 1 data, out of the 4-bit data DRADAT <3:0>, output by the second sense amplifiers 31, are selected by the multiplexers 32 so as to be latched by the latch circuits 34. The data latched by the latch circuits 34 are output from the output driver circuits 35 as first data output driver output signals DRWBSR, DRWBSF. In the next cycle t3, the selector changeover control signal DRD23 rises to take the place of the selector changeover control signal DRD01. The bit 2 data and the bit 3 data, out of the 4-bit data DRADAT <3:0>, output by the second sense amplifiers 31, are selected by the multiplexers 32 so as to be latched by the latch circuits 34. The data latched by the latch circuit 34 are output from the output driver circuits 35 as first data output driver output signals DRWBSR, DRWBSF.

Since the outstanding operation is the burst read, the column address buffer burst counter 16 updates the column address and, in the cycle t3, the column selection signal YS again rises. However, the column selector 13, different from the column selector 13, turned on in the cycle t1, is now turned on based on the column address updated by the column address buffer burst counter 16. Hence, data MIOT/B of the column different from that selected in the cycle t1 is output to the I/O line 52. This data MIOT/B is amplified by the second sense amplifiers 31 based on the second sense amplifier activation signal DRAET that again rises in the latter half of the cycle t3. Viz., in this cycle t3, the driving of the data bus 28 by the first data output driver 33, which driving is based on the selector changeover control signal DRD23, occurs simultaneously and as a parallel operation with sensing of the next burst data by the second sense amplifiers 31. This sensing is performed based on the second sense amplifier activation signal DRAET.

It is noted that 4-bit data, sensed by the second sense amplifiers 31 in the cycle t1 based on the DRAET signal, is converted into serial data by the multiplexer 32 and by the second data output driver 36. The serial data, thus produced, is output from the external I/O terminal (DQ terminal) 22, as an external output signal DQ, in the cycles t3 and t4. The 4-bit data, the data of the next burst read, sensed by the second sense amplifiers 31 based on the signal DAET in the cycle t3, is similarly converted into serial data, and output from the external I/O terminal 22 in the cycles t5 and t6 as an external output signal DQ. The column selection signal YS, the second sense amplifier activation signal DRAET, and the selector changeover control signals DRD01 and DRD23 are generated in the semiconductor device 1 based on the external clock signal CLK supplied from outside the semiconductor device 1.

Figure 6:
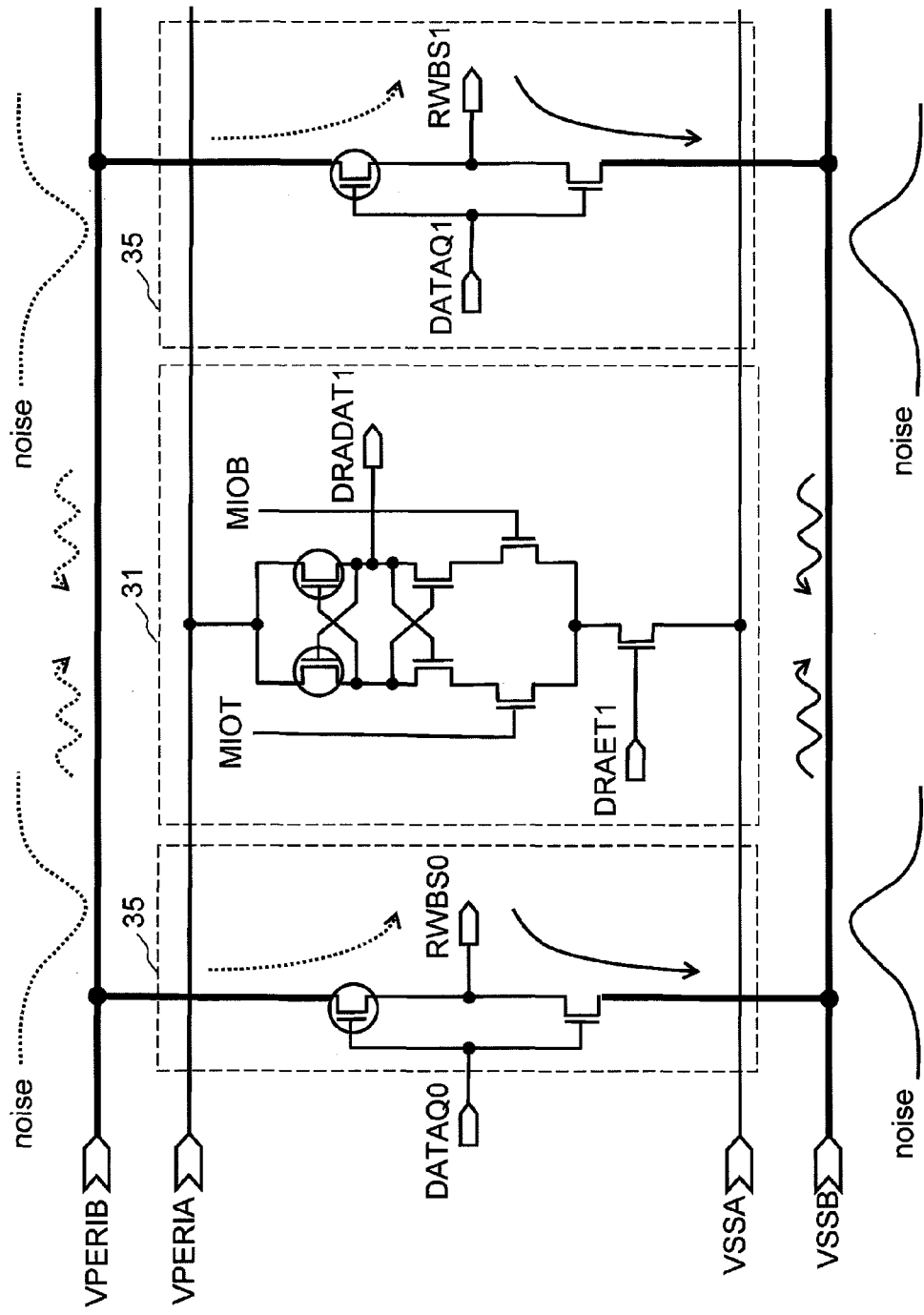
FIG. 6 is a schematic view for illustrating the power supply noise by the driver circuits and the effect of the noise on the operation of the second sense amplifier.

FIG. 6 illustrates the power supply noise produced by a driver circuit of Example 1 and its influence upon the operation of the second sense amplifiers 31. When the output driver circuit 35 of the first data output driver 33 drives the data bus 28, the current that drives the data bus will flow from the high voltage power supply interconnection VPERIB for the output driver circuit to the data bus 28. Or, the current that drives the data bus will flow from the data bus 28 to the low voltage power supply interconnection VSSB for the output driver circuit. The current generates the power supply noise in the high voltage power supply interconnection VPERIB for the output driver circuit or in the low voltage power supply interconnection VSSB for the output driver circuit. Also, in the cycle t3, the driving of the data bus 28 by the output driver circuit 35 and the data sensing by the second sense amplifiers 31 will take place simultaneously and as a parallel operation with each other. However, in Example 1, the power supply of the second sense amplifiers 31 is isolated from that of the output driver circuit 35 of the first data output driver 33. There is thus no risk that the power supply noise of the high voltage power supply interconnection VPERIB or the low voltage power supply interconnection VSSB for the output driver circuit directly affects the sensing operation by the second sense amplifiers 31.

EXAMPLE 2

Figure 7:
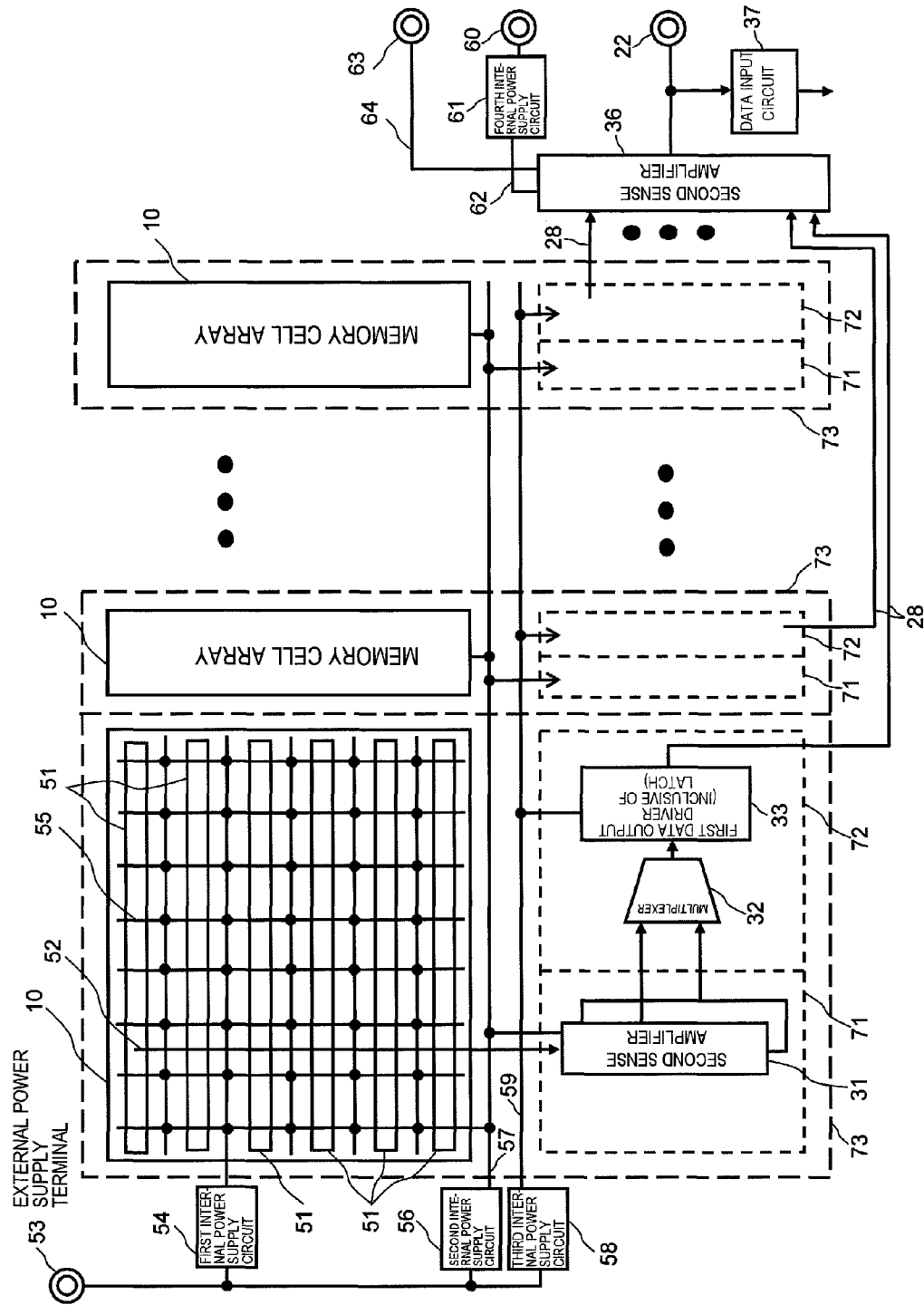
FIG. 7 is a block diagram for showing the formulation of a semiconductor device according to another example of the present invention and for illustrating the connection of power supplies.

FIG. 7 depicts a block diagram for illustrating a block arrangement and power supply connection of the semiconductor device 1 of Example 2. Since the basic configuration of the semiconductor device 1 of Example 2 is the same as that of the semiconductor device 1 of Example 1, the description of parts or components similar to those of Example 2 is dispensed with.

The configuration of the circuit of FIG. 7 will now be described. Referring to FIG. 7, there are provided a plurality of memory cell arrays 10. At least two second sense amplifiers 31 are provided externally of and in association with each memory cell array 10. These two or more second sense amplifiers 31, associated with each memory cell array 10, go to make up a second sense amplifier unit 71. An output signal of each of the second sense amplifiers 31 is coupled to an input terminal of a multiplexer 32, an output signal of which is coupled to an input terminal of a first data output driver 33. The first data output driver includes a latch circuit that retains data entered from the multiplexer 32. The multiplexer 32 and the first data output driver 33 go to make up a multiplexer/driver unit 72. The second sense amplifier unit 71 and the multiplexer/driver unit 72 are provided for each memory cell array 10. The memory cell array 10 and the second sense amplifier unit 71 as well as the multiplexer/driver unit 72, associated with the memory cell array 10, go to make up a memory cell array block 73, inclusive of the peripheral circuitry, transmitting data read out from the memory cell array 10. Only the internal formulation of the single memory cell array block 73 is shown in FIG. 7, however, the remaining memory cell array blocks 73 are also of the same formulation.

A plurality of first sense amplifier strings 51 is arranged in a striped pattern within the memory cell array 10. Each first sense amplifier string 51 is composed of a plurality of first sense amplifiers 12 and a plurality of column selectors 13 of Example 1 in a single row. To each first sense amplifier string 51 is connected an I/O line 52. Memory cell data sensed by the first sense amplifier string 51 and selected by the column address are output from the first sense amplifier string 51 to the I/O line 52. This I/O line 52 is connected to an input terminal of the second sense amplifiers 31, as in Example 1. A plurality of memory cells, not shown, are arranged in an area of the memory cell array 10 not provided with the first sense amplifier strings 51.

An output signal of the first data output driver 33 is coupled over a data bus 28 to a second data output driver 36. This second data output driver 36 converts data transmitted from a plurality of the parallel first data output drivers 33 over separate data buses 28 into serial data which is output at an external I/O terminal 22. A data input circuit 37, used in writing data in the memory cells, is provided at the external I/O terminal 22. It is noted that, while the first data output driver 33 is provided from one memory cell array 10 to another, the second data output driver 36 is provided in association with and in the neighborhood of the external I/O terminal 22. Hence, the second data output driver 36 is connected to as many data buses 28 from the first data output drivers 33 as there are the memory cell arrays 10. Meanwhile, there are occasions when a plurality of data buses 28 is derived from the single memory cell array 10. In short, the second data output driver 36 has the function of a second pipeline of effecting parallel-to-serial conversion between the memory cell array side (first data output driver side) and the external I/O terminal side of the semiconductor device 1 by the selector changeover control signals as synchronization signals. A parallel-to-serial converter circuit 81, explained later on, has a so-called FIFO (first-in first-out) function. The FIFO includes, in its input side, a plurality of latch circuits, and outputs data to the external I/O terminal 22 at a third frequency by selector changeover control signals. The third frequency is higher than a first frequency which is an operating frequency of the second sense amplifiers 31. The third frequency is also higher than a second frequency which is an operating frequency of the first data output driver 33.

The connection of a power supply system of FIG. 7 will now be described. In FIG. 7, reference numerals 53, 60 denote external power supply terminals. Although the external power supply terminals 53, 60 are shown as two terminals in FIG. 7, these terminals 53, 60 may also be a single common terminal. A first internal power supply circuit 54 delivers the power to the memory cell array 10 via a first power supply line 55 based on the power supplied from the external power supply terminal 53. A plurality of the first power supply lines 55 are arranged in a meshed pattern in the memory cell array 10. The first power supply lines 55 deliver the power to logic circuits, such as a first decoder (row decoder 11), a second decoder (column decoder 13) or a first sense amplifier control circuit. The first decoder drives a word line of each memory cell arranged in the memory cell array 10. The second decoder inputs/outputs memory cell data to the I/O line 52 connected to outside the memory cell array 10 for communication. The first sense amplifier control circuit driving-controls the first sense amplifier string 51. It is noted that the second decoder includes a so-called column switch circuit or a so-called switching circuit for switching between so-called layered data buses.

In FIG. 7, the first power supply lines 55 are connected from the first internal power supply circuit 54 to only one memory cell array 10. However, the first power supply lines 55 are connected to each of the other memory cell arrays 10. It is also possible to provide the first internal power supply circuit 54 from one memory cell array 10 to another and to connect the first power supply lines 55 to each memory cell array 10 from the first internal power supply circuit 54 provided for each memory cell array. The first power supply lines 55 in each memory cell array 10 may be connected together.

A second internal power supply circuit 56 delivers the power from the external power supply terminal 53 to each sense amplifier 31 over a second power supply line 57. The second power supply line 57 is connected with the first power supply lines 55 within the memory cell array 10. The first power supply lines 55 are connected in the meshed pattern within the memory cell array, and hence present considerable parasitic capacitances. It is possible to suppress voltage fluctuations on the second power supply line 57 by connecting the second power supply line 57 to the first power supply lines 55. It is also possible to equate the power supply system of the first sense amplifiers 12 provided in the first sense amplifier string 51 to that of the second sense amplifiers 31 by connecting the second power supply line 57 to the first power supply lines 55. The sensitivity designing of the first sense amplifiers on the driving side may thus be made equal to that of the second sense amplifiers on the receiving side. The first sense amplifiers 12 provided in the first sense amplifier string 51 and the second sense amplifiers 31 are provided with a data pre-fetch function of pre-reading a plurality of data in parallel. This data pre-reading is necessary for a DDR operation in which the data output frequency at the external I/O terminal 22 is made higher by several times than the access frequency of the memory cell array 10.

A third internal power supply circuit 58 delivers the power from the external power supply terminal 53 via a third power supply line 59 to each first data output driver 33 that includes the latch circuit 34. Even though the first data output driver 33 and the second sense amplifiers 31 belong to the same memory cell array block 73, the power is supplied to the first data output driver 33 from the third internal power supply circuit 58, while the power is supplied to the second sense amplifiers 31 from the second internal power supply circuit 56. The first data output drivers 33 and the second sense amplifiers 31 operate under the same power supply voltage. Hence, even if the data outputting timing by the first data output drivers 33 coincides with the sensing timing of the next data by the second sense amplifiers 31, due to e.g., burst readout, the second sense amplifiers 31 are not affected by the power supply noise ascribable to the first data output driver 33. Hence, the fast data transfer and fast sensing operation may proceed in parallel. It is noted that the first data output drivers 33 operate at a frequency (second frequency) which is several times as high as the operating frequency (first frequency) of the second sense amplifiers 31.

The third internal power supply circuit 58 delivers the power over the third power supply line 59 to each multiplexer 32. The first data output drivers 33 and the multiplexers 32 operate under the same power supply voltage at the same frequency.

A fourth internal power supply circuit 61 delivers the power supplied from the external power supply terminal 60 via a fourth power supply line 62 to an input of the second data output driver 36. The fourth power supply line 62 is isolated from the third power supply line 59. Hence, the inputs of the first data output drivers 33 and the input of the second data output driver 36 (a parallel-to-serial converter circuit 81 as later described) receive the power over respective different power supply lines. However, the first data output drivers 33 and the parallel-to-serial converter circuit 81 operate under the same power supply voltage. Hence, the high-speed data transfer over the data bus 28 may be made from the first data output drivers 33 operating under the second frequency to the second data output driver 36 operating under a frequency (third frequency) several times higher than the second frequency. It is because the characteristics of the first data output drivers 33 are not affected by the noise of the second data output driver 36. In particular, if a plurality of the memory cell arrays 10 are provided, as in FIG. 7, the length of the data bus 28, beginning from the memory cell array block 73, arranged at a position spaced apart from the second data output driver 36, becomes longer than the length of a side of the memory cell array 10. It is because the second sense amplifiers 31 and the first data output drivers 33 are arranged neighboring to one side of the associated memory cell array 10. Even in such case, the stabilized high speed data transfer is made possible because the power supply system (power supply interconnection) of the data output system differs from that of the data input system. If output circuits of the first data output drivers 33 and an input circuit of the second data output driver 36 are formed by CMOS circuits, and the fourth power supply line 62 is isolated from the third power supply line 59, there may be a fear that the shoot-through current or latch-up may occur due to different voltage fluctuations. In the present configuration, this problem may be avoided because the voltage drop is lesser in the circuits of the previous stage with the lower operating frequency (first data output drivers 33) than that in the circuit of the latter stage with the higher operating frequency (second data output driver 36).

The second data output driver 36 is supplied not only with the power from the fourth power supply line 62, but also with the power from an external I/O dedicated power supply terminal 63 via fifth power supply line 64. This power via the fifth power supply line is used for data input/output from or to external equipment. The inner circuit arrangement of the second data output driver 36 needs to be modified depending on whether the voltage on the fifth power supply line 64 exceeds that on the fourth power supply line 62.

Figure 8A:
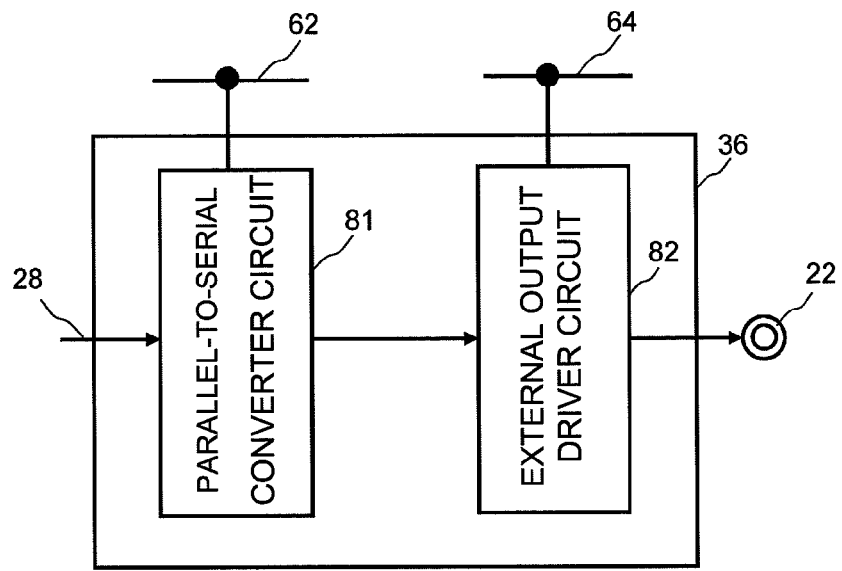
FIGS. 8A and 8B illustrate internal formulations of a second data output driver and the power supply connection in a semiconductor device according to another example of the present invention. Specifically.
Figure 8B:
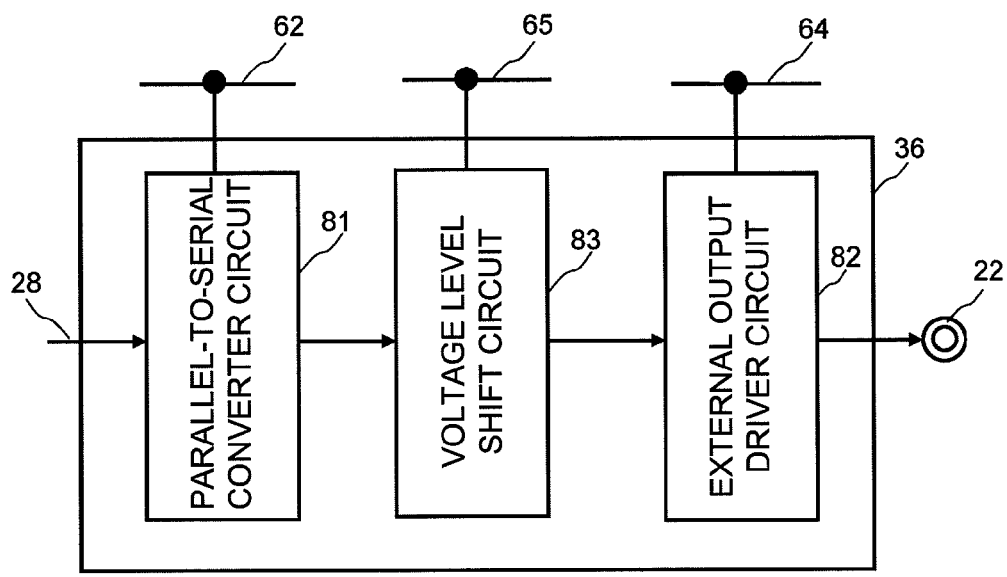

FIGS. 8A and 8B show block diagrams for illustrating the inner circuit formulation and the power supply connection of the second data output driver 36. Specifically, FIG. 8A shows a block diagram of the second data output driver 36 in case the voltage on the fifth power supply line 64 is not greater than that on the fourth power supply line 62. FIG. 8B shows a block diagram of the second data output driver 36 in case the voltage on the fifth power supply line 64 is greater than that on the fourth power supply line 62. In FIG. 8A, an output signal of the parallel-to-serial converter circuit 81, receiving a signal on the data bus 28, is directly coupled to an input terminal of an external output driver circuit 82, an output signal of which is delivered to the external I/O terminal 22. The power for the parallel-to-serial converter circuit 81 is supplied from the fourth power supply line 62, while the power for the external output driver circuit 82 is supplied from the fifth power supply line 64. Since the voltage at the fifth power supply line 64 is not greater than that at the fourth power supply line 62, no shoot-though current flows through the CMOS circuit within the external output driver circuit 82 that receives the output signal of the parallel-to-serial converter circuit 81. Hence, there is no need for providing a voltage level shifter.

In FIG. 8B, an output signal of the parallel-to-serial converter circuit 81 is coupled to an input terminal of the external output driver circuit 82 via a voltage level shift circuit 83. It is noted that the voltage on the fifth power supply line 64 is higher than the voltage on the fourth power supply line 62. Thus, a voltage level shift circuit 83 needs to be provided to prevent the shoot-through current from flowing in a CMOS circuit within the external output driver circuit 82 that is to receive an output signal of the parallel-to-serial converter circuit 81. The power is supplied from a sixth power supply line 65 to the voltage level shift circuit 83. This sixth power supply line 65 may be connected to the fifth power supply line 64 so that the voltage will be supplied from the fifth power supply line 64. Or, a voltage booster circuit may be provided within the semiconductor device 1 to boost the output voltage of one of the first to fourth internal power supply circuits to deliver the so boosted voltage to the sixth power supply line 65. The latter alternative is desirable in reliability and in operating speed because the noise of the external output driver circuit 82, operating at the highest frequency (third frequency) in the semiconductor device 1, is not directly applied to the voltage level shift circuit 83. However, in case the fifth power supply line 64 has a sufficient current supplying capacity, the former alternative is more preferred because the booster circuit, for example, may be dispensed with. In other respects, the formulation of FIG. 8B is the same as that of FIG. 8A.

The power supplied in Example 2 from the first to fourth internal power supply circuits is not limited to the high voltage power to be used as source voltages for PMOS transistors. The low voltage to be used as source voltage of the NMOS transistors may similarly be supplied from the internal power supply circuits. In particular, the high voltage power and the low voltage power may be supplied from respective different routes to the second sense amplifiers 31 and to the first data output driver 33, as in Example 1, thereby achieving the faster operation.

It is to be noted that the present invention is not limited to the Examples, described above, such that a wide variety of changes or corrections that may readily occur to those skilled in the art may be made within the scope of the invention.

What is claimed is:

1. A semiconductor device comprising:
a plurality of sense amplifiers that sense at least two data in parallel and that operate at a first frequency;
a multiplexer that operates at a second frequency higher than said first frequency and that sequentially serially outputs said data sensed in parallel; and
a driver circuit including a latch circuit connected to an output of said multiplexer and an output driver circuit; said output driver circuit being connected to said latch circuit and operating at said second frequency;
a power supply for said plurality of sense amplifiers and a power supply for said output driver circuit being of the same voltage value;
said power supply for said plurality of sense amplifiers being connected to a power supply line different from a power supply line to which said power supply for said output driver circuit is connected.

2. The semiconductor device according to claim 1, wherein said plurality of sense amplifiers sense said plurality of data in accordance with a first signal related with an external synchronization signal supplied from outside the semiconductor device;
said multiplexer sequentially serially outputting said plurality of data in accordance with a second signal related with said external synchronization signal;
said plurality of sense amplifiers performing the sensing at the time of switched outputting of said output driver circuit.

3. The semiconductor device according to claim 1, wherein the power supply of said latch circuit is connected to a power supply line to which said output driver circuit is connected.

4. The semiconductor device according to claim 1, further comprising:
a memory cell array including a plurality of memory cells and a plurality of access circuits that access said memory cells; wherein a plurality of power supply lines arranged in said memory cell array to deliver a power to said plurality of access circuits, at least one of said plurality of power supply lines in said memory cell array and a power supply for said plurality of sense amplifiers arranged externally of said memory cell array are connected together.

5. The semiconductor device according to claim 4, wherein said plurality of access circuits are arranged distributed in said memory cell array; and wherein
said plurality of power supply lines in said memory cell array are arranged in a mesh-like pattern in association with said plurality of access circuits arranged distributed in said memory cell array.

6. The semiconductor device according to claim 4, further comprising:
a first internal power supply circuit connected to an external power supply terminal that receives a power supply potential supplied from outside the semiconductor device; said first internal power supply circuit generating a voltage of the power supply for said memory cell array; and
a second internal power supply circuit connected to said external power supply terminal; said second internal power supply circuit generating a voltage of a power supply for said plurality of sense amplifiers.

7. The semiconductor device according to claim 1, further comprising:
a second internal power supply circuit connected to said external power supply terminal; said second internal power supply circuit generating a voltage of a power supply voltage for said plurality of sense amplifiers; and
a third internal power supply circuit connected to said external power supply terminal; said third internal power supply circuit generating a voltage of a power supply voltage for said output driver circuit.

8. The semiconductor device according to claim 1, further comprising:
an output buffer circuit including a parallel-to-serial converter circuit; said parallel-to-serial converter circuit operating at a third frequency higher than said second frequency and being connected to outputs of a plurality of said output driver circuits; said parallel-to-serial converter circuit receiving a plurality of output data of said plurality of output driver circuits over a data bus in parallel and sequentially serially outputting said plurality of output data;
said output buffer circuit outputting said plurality of output data to an external terminal of said semiconductor device;
a voltage of a power supply for said parallel-to-serial converter circuit being of the same value as that of said power supply for said output driver circuit;
the power supply for said parallel-to-serial converter circuit and the power supply for said output driver circuit being connected to respective different power supply lines.

9. The semiconductor device according to claim 8, further comprising:
a fourth internal power supply circuit connected to said external power supply terminal; said fourth internal power supply circuit generating the voltage of the power supply for said parallel-to-serial converter circuit.

10. The semiconductor device according to claim 8, further comprising:
a plurality of memory cell arrays; each of said memory cell arrays including a plurality of memory cells and a plurality of access circuits that access said memory cells;
a plurality groups of said plurality of sense amplifiers, a plurality of said multiplexers and a plurality of said output driver circuits being corresponding to said plurality of memory cell arrays; each group of said plurality of sense amplifiers, each of said multiplexers and each of said output driver circuits being corresponding to one of said plurality of memory cell arrays.

11. The semiconductor device according to claim 10, wherein
each group of said plurality of sense amplifiers, each of said multiplexers and each of said output driver circuits are arranged in adjacency to a side of corresponding one of said plurality of memory cell arrays;
said plurality of memory cell arrays being arranged neighboring to one another for extending in the same direction as that of said side; the length of said data bus interconnecting said plurality of output driver circuits, each of output driver circuits being provided corresponding to one of said memory cell arrays, and said parallel-to-serial converter circuit provided common to said plurality of memory cell arrays, being longer at least than the length of said one side of one of said memory cell arrays.

12. A semiconductor device comprising:
a plurality of sense amplifiers that sense at least two data in parallel and that operate at a first frequency;
a multiplexer that operates at a second frequency higher than said first frequency and that sequentially serially outputs said data sensed in parallel;
a latch circuit connected to an output of said multiplexer; and
an output driver circuit that outputs data of said latch circuit to a data bus at said second frequency;
said plurality of sense amplifiers sequentially time-divisionally sensing a number of data in excess of the number of said sense amplifiers; the sequentially sensed multiple data being pipeline-processed by said multiplexer so as to be sequentially output from said output driver circuit to said data bus;
said plurality of sense amplifiers and said output driver circuit operating at the same power supply voltage;
a power supply for said plurality of sense amplifiers and a power supply for said output driver circuit being connected to respective different power supply lines.

13. The semiconductor device according to claim 12, wherein
the sensing operation of said plurality of sense amplifiers and the operation of said multiplexer of sequentially outputting said multiple data are performed based on an external synchronization signal delivered from outside the semiconductor device.

14. The semiconductor device according to claim 12, further comprising:
a memory cell array including a plurality of memory cells and a plurality of access circuits that access said memory cells;
said plurality of sense amplifiers being a plurality of external sense amplifiers arranged externally of said memory cell array;
said memory cell array including, in an inner part thereof, a plurality of internal sense amplifiers differing from said plurality of external sense amplifiers;
said plurality of external sense amplifiers operating for further amplifying a plurality of data sensed by said plurality of internal sense amplifiers;

a power supply in said memory cell array for supplying a power to said plurality of access circuits being connected to said power supply for said plurality of external sense amplifiers.

15. The semiconductor device according to claim 14, further comprising:
a first internal power supply circuit connected to an external power supply terminal that receives a potential of a power supply delivered from outside of the semiconductor device; said first internal power supply circuit generating a voltage of a power supply within said memory cell array;
a second internal power supply circuit connected to said external power supply terminal, said second internal power supply circuit generating a voltage of a power supply for said plurality of external sense amplifiers; and
a third internal power supply circuit connected to said external power supply terminal, said third internal power supply circuit generating a voltage of a power supply for said output driver circuit.

16. A semiconductor device comprising:
a plurality of first circuits that operate at a first frequency and that sense first data to output a sensed first data each;
a second circuit that operates at a second frequency higher than said first frequency; said second circuit receiving a plurality of said sensed first data in parallel and serially outputting as a second data; and
a third circuit that latches the second data output from said second circuit and that amplifies and outputs the second data latched; wherein
said first circuits and said third circuit operate under the same power supply voltage;
a first power supply that supplies a power to said plurality of first circuits and a third power supply that supplies a power to said third circuit being connected to respective different power supply lines.

17. The semiconductor device according to claim 16, further comprising:
a fourth circuit that operates at a third frequency higher than said second frequency; said fourth circuit receiving a plurality of said second data, amplified and output, in parallel, and serially outputting as a third data;
said third circuit and said fourth circuit operating under the same power supply voltage;
said third power supply and a fourth power supply that supplies a power to said fourth circuit being connected to respective different power supply lines.

18. The semiconductor device according to claim 16, further comprising:
a memory cell array including a plurality of memory cells corresponding to a plurality of said first data each, a plurality of access circuits that access said memory cells and a plurality of power supply lines that supply a power to said access circuits;
said access circuits being arranged distributed in said memory cell array;
said plurality of power supply lines in said memory cell array being arranged in a meshed pattern in association with said access circuits arranged distributed in said memory cell array;
at least one of said plurality of power supply lines that supply the power to said plurality of access circuits in at least one of said memory cell arrays being connected to said first power supply that supplies the power to said plurality of first circuits.

19. The semiconductor device according to claim 18, further comprising:
a plurality of said memory cell arrays;
a fourth circuit operating under a third frequency higher than said second frequency; said fourth circuit receiving said second data, amplified and output, in parallel, and serially outputting third data;
a plurality of said first circuits, a plurality of said second circuits and a plurality of said third circuits being provided coordinated to each of said plurality of said memory cell arrays;
said fourth circuit being provided common to said multiple memory cell arrays; and
a plurality of internal data lines interconnecting an input terminal of said fourth circuit and output terminals of said multiple third circuits;
the length of at least one of said internal data lines being longer than the length of said memory cell array.

20. The semiconductor device according to claim 16, further comprising:
first and third internal power supply circuits connected to an external power supply terminal that receives the power supply potential from outside of the semiconductor device; said first and third internal power supply circuits respectively generating the voltages of said first and third power supplies.

* * * * *